United States Patent [19]

Howe et al.

[11] Patent Number: 5,542,295

[45] Date of Patent: Aug. 6, 1996

[54] APPARATUS TO MINIMIZE STICTION IN MICROMACHINED STRUCTURES

[75] Inventors: Roger T. Howe, Lafayette, Calif.; H. Jerome Barber, Winchendon; Michael Judy, North Andover, both of Mass.

[73] Assignee: Analog Devices, Inc.

[21] Appl. No.: 348,377

[22] Filed: Dec. 1, 1994

[51] Int. Cl.$^6$ .................................................... G01P 15/08
[52] U.S. Cl. ................................. 73/514.18; 73/DIG. 1; 361/283.2
[58] Field of Search ........................... 73/514.32, 514.18, 73/514.29, 514.36, DIG. 1; 361/283.2, 283.3

[56] References Cited

U.S. PATENT DOCUMENTS

| | | | |
|---|---|---|---|
| 5,314,572 | 5/1994 | Core et al. | 156/643 |
| 5,337,606 | 8/1994 | Bennett et al. | 73/514.32 |
| 5,345,824 | 9/1994 | Sherman et al. | 73/514.18 |
| 5,392,650 | 2/1995 | O'Brien et al. | 73/514.18 |
| 5,447,068 | 9/1995 | Tang | 73/514.32 |

*Primary Examiner*—Hezron E. Williams
*Assistant Examiner*—Helen C. Kwok
*Attorney, Agent, or Firm*—Hale and Dorr

[57] ABSTRACT

An electro-mechanical micromachined structure uses bumpers to prevent contact between structures at different potentials. A beam is connected to one or more anchors by flexible suspensions, which permit the beam to move along a predetermined axis relative to one or more plates. The suspension includes at least one bumper positioned so that the bumper will contact another part of the suspension before the beam contacts the plates. The bumper is made from the same material as the suspension, during the same processing step. The bumper is positioned to take advantage of shrinkage or expansion of the beam during processing which forces the bumper closer to its contact point then would otherwise be possible.

20 Claims, 3 Drawing Sheets

APPARATUS TO MINIMIZE STICTION IN MICROMACHINED STRUCTURES

FIELD OF THE INVENTION

This invention relates to the field of electro-mechanical micromachined structures and, more particularly, to structures for minimizing stiction in electro-mechanical micromachined structures.

BACKGROUND OF THE INVENTION

In existing electro-mechanical micromachined structures, such as sensors and accelerometers, certain micromachined silicon structures are designed to move relative to the substrate or other micromachined structures in response to forces being applied in a predetermined manner, such as along a predetermined axis of the device. The movement of certain of the structures permits the generation of signals proportional to the magnitude, direction, and/or duration of the force.

Typically, the movable structures are at a different potential from other structures. For example, a movable structure might be constructed with fingers adjacent and parallel to the fingers of one or more fixed (non-moving) structures, with all of these structures in a plane above the substrate. The movable structure and the fixed structure form a capacitor, whose capacitance changes when the movable structure moves in response to the force. A micromachined structure utilizing this arrangement to detect acceleration is described in commonly assigned U.S. Pat. Nos. 5,345,824 and 5,314,572, which are incorporated herein by reference.

If a finger from the movable structure moves into contact with a finger from the fixed structure, the fingers can stick due to electrostatic attraction and even fuse together, causing the device to fail. Even where the movable structure moves into contact with another structure that is nominally at the same potential, if the two structures are not fabricated from the same material, there will be a difference in work functions that will cause an electrostatic attraction and possible device failure through stiction. Even if the materials are nominally the same, there will be small differences in work function due to small differences in composition, if they were deposited at different times during the device fabrication.

Electrostatic attraction is one of several forces responsible for stiction of contacting structures. Van der Waals and capillary forces (if water vapor is present) are two additional forces that contribute to stiction. The present invention eliminates the electrostatic force which occurs when structures not at the same potential come into contact and, therefore, makes the device more robust against stiction.

SUMMARY OF THE INVENTION

The present invention is directed to a micromachined structure in which the movable structure includes bumpers positioned so as to limit the movement of the movable structure and to ensure that the movable structure contacts no other structure. The bumpers are arranged to take advantage of expansion or contraction of the movable structure during processing, to provide an optimal limit to the movement of the movable structure.

In the micromachined structure of the present invention, the movable structure includes a sensing portion and at least one flexible suspension portion. One end of each suspension portion is anchored to the substrate and the other end connects to the sensing portion. In a preferred embodiment, the structure includes two suspension portions, positioned at opposite ends of the sensing portion, and the suspension portions permit the structure to move along an axis that runs from one suspension portion through the sensing portion to the other suspension portion. Movement along the axis causes the distance between the ends of one suspension portion to increase and the distance between the ends of the other suspension portion to decrease.

The micromachined structure also includes at least one fixed structure. Preferably, the fixed structures include a series of plates parallel and adjacent to a series of fingers of the movable structure. The axis along which the movable structure moves is in a horizontal plane formed by the plates and the fingers above the substrate surface. The movable structure and each fixed structure form a capacitor for which the capacitance changes as the movable structure moves in response to a force along the axis.

Bumpers are positioned on the suspension portion between the anchor end and the sensing end, so that the movable structure will contact itself, stopping further movement of the movable structure, before the movable structure contacts any other structure. The bumper reduces the area of contact. It is formed as part of the structure, so there will be no electrostatic forces or transfer of charges between the bumper and any other part of the suspension. If the bumper were formed of a different material, or even at a different time, there could be potential differences that would cause electrostatic forces. Preferably, the bumper has a blunt tip to prevent wear from repeated contact between the tip and its contact point.

Preferably, the gap between the bumper and the part of the movable structure with which the bumper will contact (the "bumper gap") is at most two-thirds of the distance between the movable structure and the closest plate of a fixed structure (the "plate gap"). In a preferred embodiment, when the bumper contacts the movable structure, the spring force of the suspension is greater than the net electrostatic force between the movable structure and the fixed structures. Otherwise, when the force along the axis is removed, the electrostatic forces could prevent the movable structure from returning to its neutral position. If the movable structure is held against the bumper, stiction due to Van der Waals forces or other phenomena is much more likely.

Preferably, the movable structure is formed by depositing a layer of polysilicon, etching it into the desired forms, and then removing the spacer layer underneath it to leave the movable structure suspended above the substrate. It is well-known that polysilicon often is in a state of residual tension or residual compression after completion of the deposition and stress-annealing processes. Upon release from the substrate after removal of the sacrificial layer, the movable structure and attached suspension will contract (if it was under residual tension) or expand (if it was under residual compression) and, therefore, change the gaps between it and its adjacent structures. The bumpers according to the present invention take advantage of this expansion or contraction to permit closer spacing of structures than otherwise would be possible. The suspension is designed so that expansion or contraction of the movable structure, which affects the sensing end of the suspension more than the anchor end, reduces the bumper gap. This permits the device to be designed so that the plate gap is as small as permitted by the fabrication process being used to manufacture the micromachined structure, while the final bumper gap becomes smaller than the plate gap.

An object of the present invention is to provide an improved micromachined structure.

A further object of the present invention is to provide a micromachined structure constructed to minimize stiction.

Another object of the present invention is to provide a micromachined structure constructed to minimize stiction while allowing for minimal spacing between adjacent structures.

DETAILED DESCRIPTION OF THE INVENTION

Figure 1:
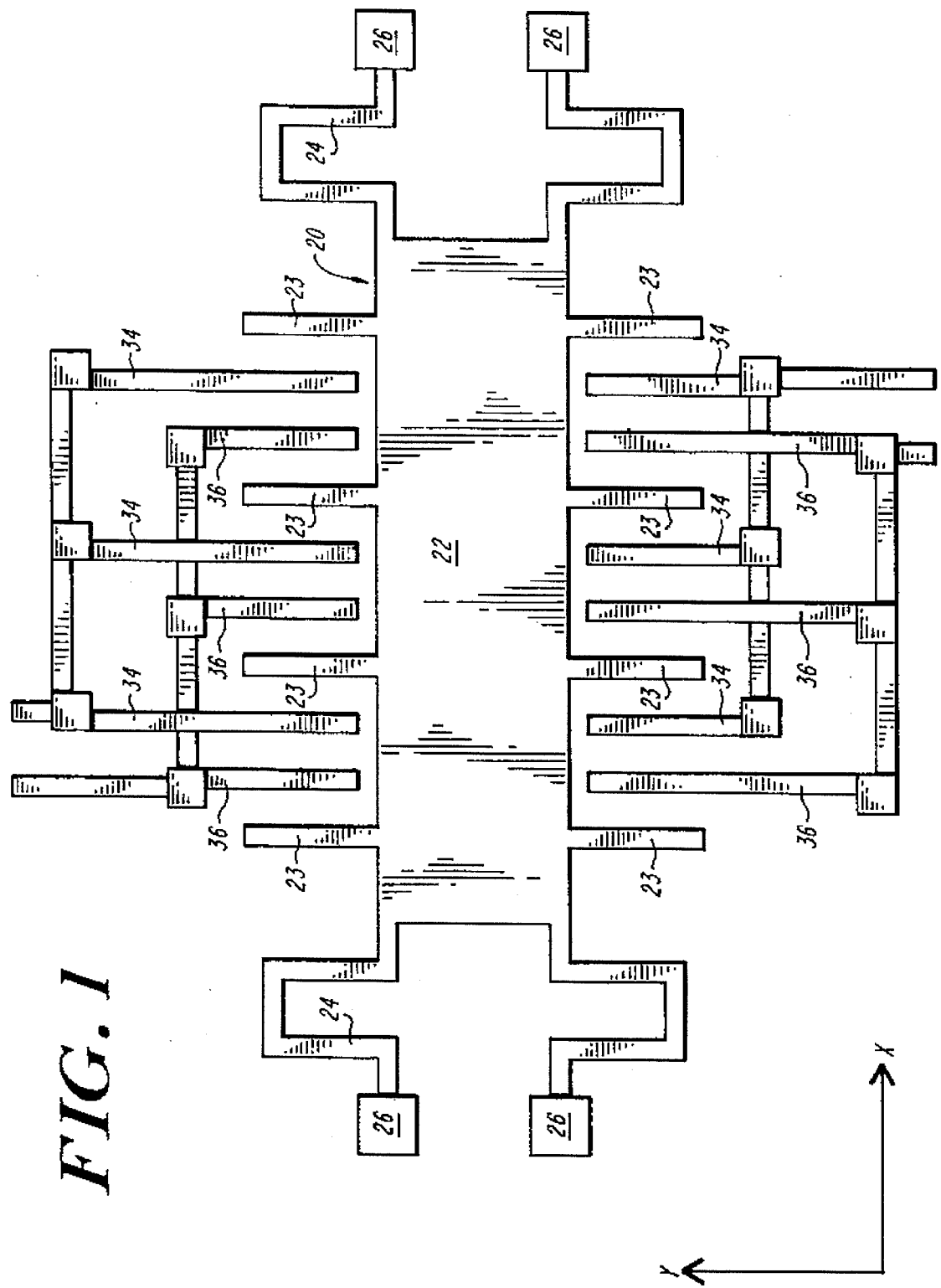
FIG. 1 is a top view of a micromachined electro-mechanical structure employing the bumpers of the present invention.

With reference to FIG. 1, a portion of a micromachined electro-mechanical structure is shown. A polysilicon movable mass 20 includes a central beam 22, from which extend fingers 23. At the ends of central beam 22 are suspensions 24. Suspensions 24 connect to anchors 26, which suspend movable mass 20 above the substrate. Suspensions 24 permit movable mass 20 to move along the X-axis in response to a force having a component along the X-axis. Fixed plates 34 and 36 are interleaved between mass fingers 23 to form a differential capacitor. The capacitance of the differential capacitor changes in response to movement of mass 20 and its fingers 23 relative to fixed plates 34 and 36.

Figure 2:
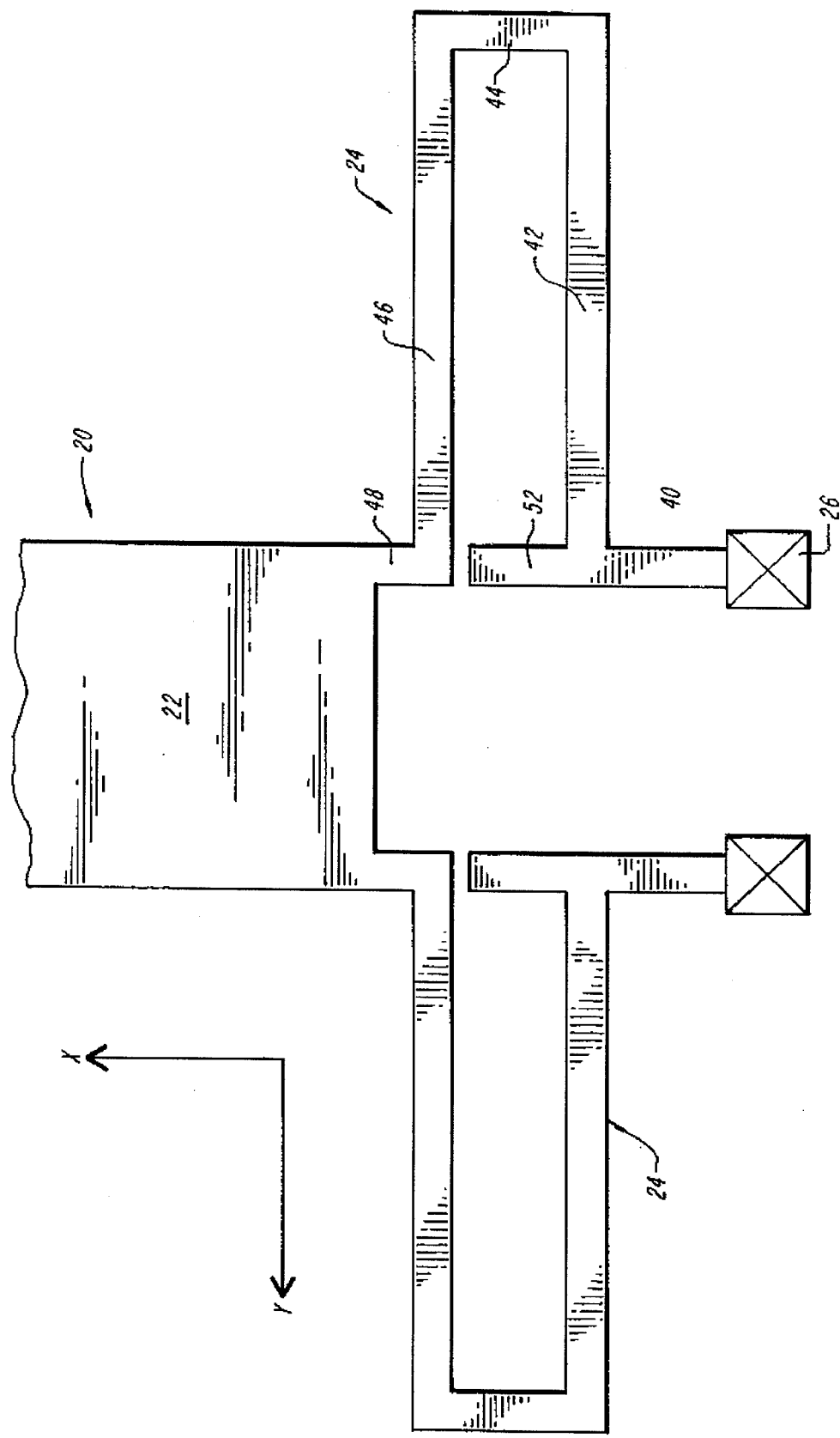
FIG. 2 is a top view of the region around the bumpers according to a first embodiment of the present invention.

A bumper for the micromachined structure of FIG. 1 is shown in FIG. 2. This design preferably is used in the situation where the structure expands. Suspension 24 includes anchor segment 40, outer flexing segment 42, connecting segment 44, inner flexing segment 46, and beam segment 48. Preferably, these segments are etched from a single layer of polysilicon. One end of anchor segment 40 connects to anchor 26 and the other end connects to a first end of outer flexing segment 42. One end of beam segment 48 connects to one end of central beam 22 and the other end connects to a first end of inner flexing segment 46. Connecting segment 44 connects a second end of inner flexing segment 46 to a second end of outer flexing segment 42. Preferably, anchor segment 40 and beam segment 48 are collinear and are parallel to connecting segment 44 and all three segments are parallel to the X-axis. Preferably, inner flexing segment 46 is parallel to outer flexing segment 42 and both segments are parallel to the Y-axis.

Bumper 52 extends inward from outer flexing segment 42 toward inner flexing segment 46, along a line from anchor segment 40 to beam segment 48. Bumper 52 is formed at the same time as the rest of suspension 24, from the same polysilicon layer. As movable mass 20 moves toward anchor 26, inner flexing segment 46 will strike bumper 52, preventing further movement. Alternatively, bumper 52 could be formed on inner flexing segment 46, extending toward outer flexing segment 42. Because there is a bumper on suspension 24 on each end of central beam 22, movement of movable mass 20 is limited in both directions along the X-axis.

Central beam 22 of movable mass 20 in FIG. 2 expands when the. spacing layer underneath it is etched away as a result of the built-in residual compressive stress. As a result, the distance between bumper 52 and inner flexing segment 46 is less than the distance when the polysilicon layer was etched to form suspension 24. This bumper gap is such that when bumper 52 contacts inner flexing segment 46 the spring force tending to return movable mass 20 to its neutral position, from suspension 24, is greater than the net electrostatic force on mass fingers 23 from fixed plates 34 and 36 tending to pull movable mass 20 away from its neutral position. This ensures that when the force that moved movable mass 20 disappears, movable mass 20 will return to its neutral position and not become stuck. Preferably, the bumper gap is approximately two-thirds the distance from each finger 23 to the adjoining plates 34 and 36 (FIG. 1).

Figure 3:
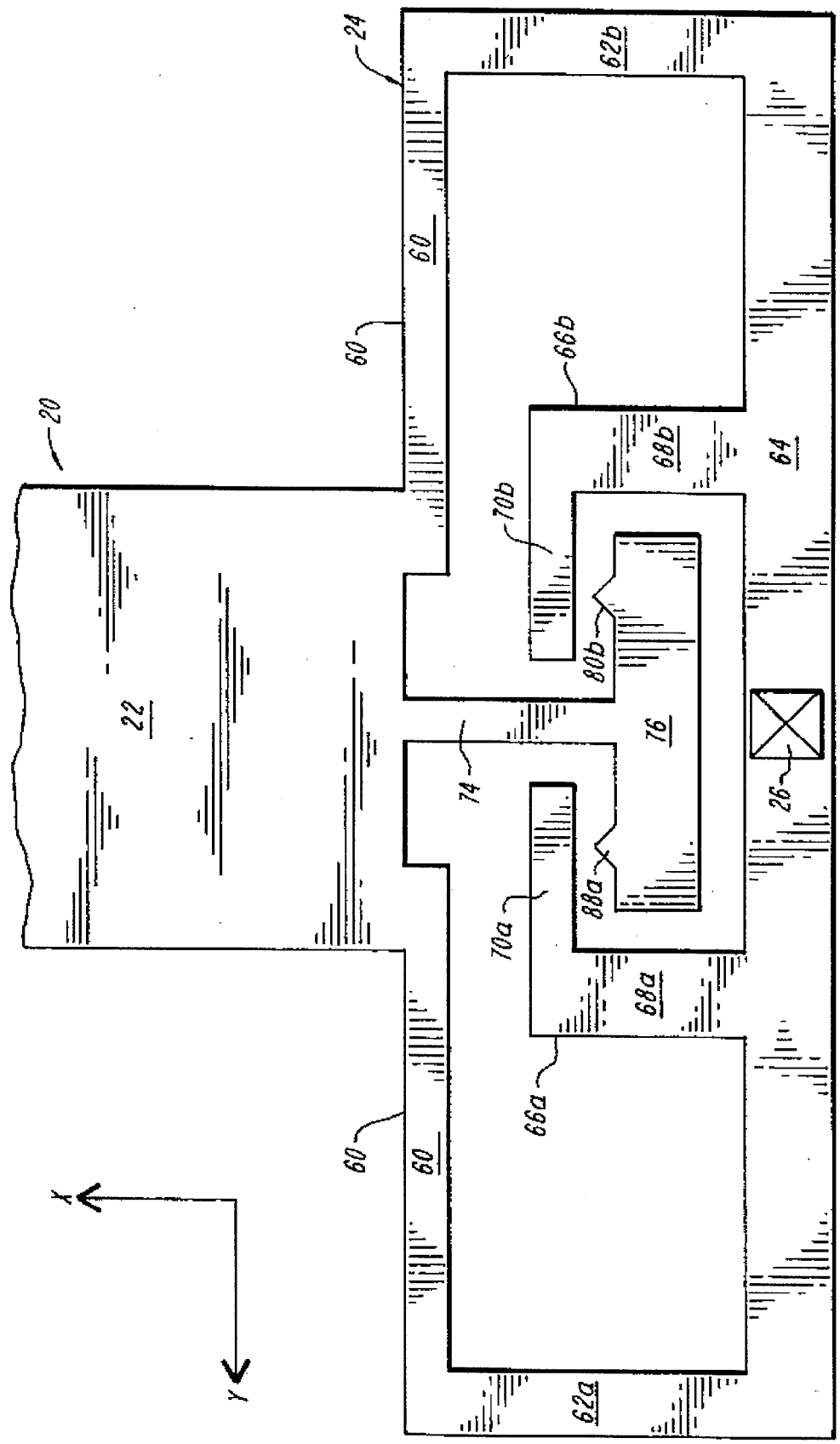
FIG. 3 is a top view of the region around the bumpers according to a second embodiment of the present invention.

A second embodiment of the bumpers and suspension of the present invention is shown in FIG. 3. This design preferably is used in the situation where the structure contracts. Suspension 24 is formed at the same time as central beam 22, from the same layer of polysilicon. Structure segment 60 is parallel to the Y-axis and connects to an end of central beam 22. Structure segment 60 includes flexing segments 60a and 60b. The outer ends of flexing segments 60a and 60b connect to the inner ends of end segments 62a and 62b, which extend along the X-axis away from central beam 22. Anchor segment 64 lies along the Y-axis, and is connected to the substrate by anchor 26, which is located at the mid-point of anchor segment 64. The ends of anchor segment 64 connect to the outer ends of end segments 62a and 62b. This structure permits movable mass 20 to move along the X-axis.

Extending inward from anchor segment 64 are bumper contact segments 66a and 66b. Bumper contact segments 66a and 66b include spacers 68a and 68b, which extend parallel to the X-axis from outer segment 64, and contacts 70a and 70b, which are collinear and extend parallel to the Y-axis toward each other.

Extending parallel to the X-axis from the middle of the end of central beam 22 is extender 74. Extender 74 extends past contacts 70a and 70b, and forms a "T" with bumper carrier 76. Bumper carrier 76 extends parallel to the Y-axis opposite contacts 70a and 70b, between spacers 68a and 68b.

On the inner side of bumper carder 76, facing contacts 70a and 70b, are bumpers 80a and 80b. As movable mass 20 moves away from anchor 26, bumpers 80a and 80b strike contacts 70a and 70b, preventing further movement. Alternatively, bumpers 80a and 80b could be formed on the outer side of contacts 70a and 70b, extending toward bumper carrier 76. Or, bumpers 80a and 80b can be omitted, so that bumper carrier 76 and contacts 70a and 70b contact directly. Because there are bumpers on suspension 24 on each end of central beam 22, movement of movable mass 20 is limited in both directions along the X-axis.

Central beam 22 of movable mass 20 in FIG. 3 contracts when the spacing layer underneath it is removed as a result of the built-in residual tensile stress. As a result, the distance between bumpers 80a and 80b and contacts 70a and 70b is less than the distance when the polysilicon layer was etched to form suspension 24. As with the embodiment shown in FIG. 2, this bumper gap is such that when bumpers 80a and 80b reach contacts 70a and 70b the spring force tending to return movable mass 20 to its neutral position, from suspension 24, is greater than the net electrostatic force on mass fingers 23 from fixed plates 34 and 36 tending to pull movable mass 20 away from its neutral position. Preferably, the bumper gap is approximately two-thirds the distance from each finger 23 to the adjoining plates 34 and 36.

Many variations on the above-described bumper design are possible. For example, bumpers 80a and 80b could be placed on the opposite side of bumper carrier 76 or on both sides of bumper carrier 76. This would permit this bumper design to be used where central beam 22 is designed to expand or where it might be designed either to expand or to contract. Or, extender 74 could connect to anchor segment 64. In that case, bumper contact segments 66a and 66b would connect to central beam 22 or, if central beam 22 were designed to expand, bumper contact segments 66a and 66b could be omitted. These designs also could be used where central beam 22 neither expands nor contracts, as long as the bumper gap is less than the distance from each finger 23 to the adjoining plates 34 and 36.

While there have been shown and described examples of the present invention, it will be readily apparent to those skilled in the art that various changes and modifications may be made therein without departing from the scope of the invention as defined by the appended claims. Accordingly, the invention is limited only by the following claims and equivalents thereto.

We claim:

1. A micromachined electro-mechanical structure comprising:

an anchor connected to a substrate;

a first structure suspended above the substrate, having a first structure edge;

a second structure suspended above the substrate, having a second structure edge at a first distance along an axis parallel to the substrate from the first structure edge; and a suspension suspended above the substrate, having a first end connected to the anchor and a second end connected to the first structure, so that the first structure is movable along the axis, the suspension further having a first bumper segment having a first segment edge, a second bumper segment having a second segment edge, and a bumper integral with the first segment edge, at a second distance along the axis from the second segment edge, wherein upon movement of the first structure a first amount in a first direction along the axis the bumper contacts the seconds segment edge and the first structure edge does not contact the second structure edge.

2. The structure according to claim 1, wherein the suspension and the bumper are formed from the same material during a single processing step.

3. The structure according to claim 2, wherein the suspension and the bumper include polysilicon.

4. The structure according to claim 2, wherein a spring constant of the suspension is sufficiently large that when the bumper is in contact with the second segment edge a spring force of the suspension is greater than an electrostatic force between the first structure and the second structure.

5. The structure according to claim 2, wherein the second distance is at most two-thirds the first distance.

6. The structure according to claim 2, wherein the first segment edge is parallel to the second segment edge.

7. The structure according to claim 2, wherein the suspension further includes anchor-connecting means for connecting a first end of the first bumper segment to the anchor, structure-connecting means for connecting a first end of the second bumper segment to the first structure, and bumper segment connecting means for connecting a second end of the first bumper segment to a second end of the second bumper segment.

8. The structure according to claim 7, wherein the anchor-connecting means includes an anchor segment having a first end connected to the anchor and a second end connected to the first end of the first bumper segment.

9. The structure according to claim 8, wherein the structure-connecting means includes a structure segment having a first end connected to the first structure and a second end connected to the first end of the second bumper segment.

10. The structure according to claim 9, wherein the bumper segment connecting means includes a connecting segment having a first end connected to the second end of the first bumper segment and a second end connected to the second end of the second bumper segment.

11. The structure according to claim 10, wherein the first structure expands during manufacture.

12. The structure according to claim 2, wherein the suspension further includes anchor-connecting means for connecting a first end of the second bumper segment to the anchor, structure-connecting means for connecting a first end of the first bumper segment to the first structure, and bumper segment connecting means for connecting a second end of the second bumper segment to a second end of the first bumper segment.

13. The structure according to claim 12, wherein the anchor-connecting means includes an anchor segment having a first end connected to the anchor and a second end connected to the first end of the second bumper segment.

14. The structure according to claim 13, wherein the structure-connecting means includes a structure segment having a first end connected to the first structure and a second end connected to the first end of the first bumper segment.

15. The structure according to claim 14, wherein the bumper segment connecting means includes a connecting segment having a first end connected to the second end of the second bumper segment and a second end connected to the second end of the first bumper segment.

16. The structure according to claim 15, wherein the first structure expands during manufacture.

17. A micromachined electro-mechanical structure comprising:

an anchor connected to a substrate;

a first structure suspended above the substrate, having a first structure edge;

a second structure suspended above the substrate, having a second structure edge at a first distance along an axis parallel to the substrate from the first structure edge;

a suspension suspended above the substrate, having a first end connected to the anchor and a second end connected to the first structure, so that the first structure is movable along the axis; and a bumper section having a first bumper segment connected to the suspension and having a first segment edge, and a second bumper segment connected to the first structure and having a second segment edge at a second distance along the axis from the first segment edge, wherein upon movement of the first structure a first amount in a first direction along the axis the first segment edge contacts the second segment edge and the first structure edge does not contact the second structure edge.

18. The structure according to claim 17, wherein the first structure contracts during manufacture.

19. The structure according to claim 17, wherein the suspension has an anchor part connected to the anchor and a structure part connected to the first structure, and wherein the first bumper segment connects to the anchor part.

20. The structure according to claim 19, wherein the first segment edge is between the second segment edge and the first structure.

* * * * *